United States Patent [19]

Häusler et al.

[11] Patent Number: 4,555,658

[45] Date of Patent: Nov. 26, 1985

[54] CIRCUIT ARRANGEMENT FOR THE COMPENSATION OF REACTIVE POWER IN AN ELECTRICAL ALTERNATING-CURRENT POWER SYSTEM

[75] Inventors: Michael Häusler, Weilheim, Fed. Rep. of Germany; Philippe Huber, Nussbaumen; Walter Pfyl, Ennetbaden, both of Switzerland; Kadry Sadek, Lauchringen, Fed. Rep. of Germany

[73] Assignee: BBC Brown, Boveri and Company, Limited, Baden, Switzerland

[21] Appl. No.: 547,587

[22] Filed: Nov. 1, 1983

[30] Foreign Application Priority Data

Nov. 2, 1982 [CH] Switzerland .................. 6354/82

[51] Int. Cl.[4] ............................................. H02J 3/18
[52] U.S. Cl. ...................................... 323/210; 361/13
[58] Field of Search ............... 323/208, 209, 210, 211; 361/8-9, 13

[56] References Cited

U.S. PATENT DOCUMENTS 3,731,183 5/1973 Johnson et al. ................. 323/210 X
4,292,545 9/1981 Hingorani ....................... 323/210 X
4,470,005 9/1984 Gyugyi .............................. 323/210

OTHER PUBLICATIONS

P. Wetzel: "Thyristor Protection with Semiconductors—Economical and Safe", BBC-Nachrichten, vol. 59, No. 3/4, 1977, pp. 152–158.

H. Frank: "Thyristor-Controlled Shunt Compensation in Power Networks", ASEA Journal, vol. 54, No. 5/6, 1981, pp. 121–127.

Primary Examiner—Peter S. Wong
Attorney, Agent, or Firm—Oblon, Fisher, Spivak, McClelland & Maier

[57] ABSTRACT

A compensation circuit for reactive power balance includes a capacitor, inductor and rectifier connected in series to a power system. In order to protect the rectifier from misfires of the thyristors, two discharge devices are connected in parallel to the series circuit from the common points in the series circuit. This protects the thyristors in case of a double misfire.

6 Claims, 2 Drawing Figures

CIRCUIT ARRANGEMENT FOR THE COMPENSATION OF REACTIVE POWER IN AN ELECTRICAL ALTERNATING-CURRENT POWER SYSTEM

BACKGROUND OF THE INVENTION

1. Field of the Invention;

The invention pertains generally to a circuit arrangement for the compensation of reactive power in a power system and more particularly to a circuit arrangement for the compensation of reactive power having protective devices in case of misfiring by the circuit.

2. Description of the Prior Art:

Circuit arrangements of this general type are known in the prior art as can be seen in an article by H. Frank and S. Ivener, "Statische Blindstromkompensation in der elektrischen Stromversorgung" [Statical Reactive Power Compensation in Electrical Power Supply] appearing in the house organ ASEA-ZEITSCHRIFT 1981, Vol. 26, No. 5–6, pp. 113–119.

This prior art device includes a thyristor rectifier contained in the circuit arrangement which is simply constructed from two anti-parallel thyristors or from two antiparallel-connected thyristors in a series circuit, to whose control electrodes a control circuit is connected with ignites or triggers the thyristors. This occurs when there is a need for improvement of the reactive power balance or for reasons of voltage maintenance in the alternating-current voltage system. Triggering should only be accomplished at moments when the instantaneous value of the alternating-current voltage specifically displays a minimum at the thyristor rectifier in order to prevent damage to the thyristors.

Triggering of the thyristors at any other moment can have serious consequences for the thyristors, up to and including their destruction. Since such misfires cannot be wholly avoided, an inductor and a discharge or grounding device provided for the protection of the thyristors in the prior art circuit arrangement, with this discharge device being connected directly above the thyristor rectifier. The inductor has the task of limiting the transfer current flowing across the capacitor following a misfire. The discharge device has the task of preventing an overvoltage condition as soon as the previously conductive thyristor has again switched back to the off-state. This overvoltage would, without the effect of the discharge device reach a value equal to the difference beween the capacitor voltage and the system voltage, aned could amount to more than triple the amplitude of the system voltage. The overvoltage would be particularly critical for the previously misfired thyristor, since it may be greatly overheated from the previous transfer current and therefore be substantially reduced in its overvoltage resistance.

The disadvantage of this prior art circuit arrangement, however, is that the inductor and the discharge device afford protection only against a single misfire. In the event of a double misfire, when a second misfire occurs shortly after a first one, the destruction of the thyristor rectifier can still occur in the prior art circuit system.

SUMMARY OF THE INVENTION

The present invention fashions in a simple way a circuit arrangement of the type mentioned above in such a way that the destruction of the thyristor rectifier can be avoided even in the event of a double misfire.

The present invention works under the assumption that the destruction of the thyristor rectifier of the prior art circuit arrangement is caused, in the event of a double misfire, by the commutation taking place at the time of the second misfire, of the current flowing in the discharge device after the first misfire. If, as in the case of the prior art circuit arrangement, the discharge device is connected directly abve the thyristor rectifier, then, in the event of this current commutation, a steep voltage increase ensues in the misfired thyristor leading to local overheating in the thyristor.

An inductor specifically provided in order to limit the current, in the prior art circuit arrangement, is located outside the current path of the commutation current and thus has no effect on this current. The advantages achieved by the present invention can essentially be seen in the fact that the inductor is located not only in the current path of the transfer current of the capacitor but also in the current path of the commutation current, thus operating to limit both currents.

The protective effect of the discharge device with respect to overvoltage at the thyristor rectifier remains unaffected by the invention's circuit arrangement.

In the preferred embodiment of the invention, an additional discharge device is connected directly above the thyristor, next to the discharge device which is connected above the thyristor rectifier and the inductor, this latter discharge device being hereinafter referred to as the first discharge device. The second discharge device affords additional protection against acute transient overvoltages at the thyristor rectifier. It can, with respect to capacity, be weaker than the first discharge device which also can be designed weaker than the performance value of the second discharge device. So that the second discharge device does not assume the function of the first discharge device, its protective level must be at least as high or preferably higher than that of the first discharge device.

Accordingly, one object of the invention is to provide an improved circuit arrangement for the compensation of reactive power in an electrical alternating current power system.

Another object of the invention is to provide an improved circuit arrangement for the compensation of reactive power have protection against misfiring of a rectifier.

A further object of the invention is to provide a circuit arrangement for the compenstion of reactive power having protection against a double misfiring of a rectifier.

A still further object of the invention is to provide an improved and reliable circuit arrangment for the compensation of reactive power with protection against misfiring being provided by a plurality of discharge devices.

BRIEF DESCRIPTION OF THE DRAWINGS

A more complete appreciation of the characteristics and advantages of the invention will become evident from the following detailed description of the invention when considered in connection with the attached drawings, wherein.

DESCRIPTION OF THE PREFERRED EMBODIMENTS

Figure 1:
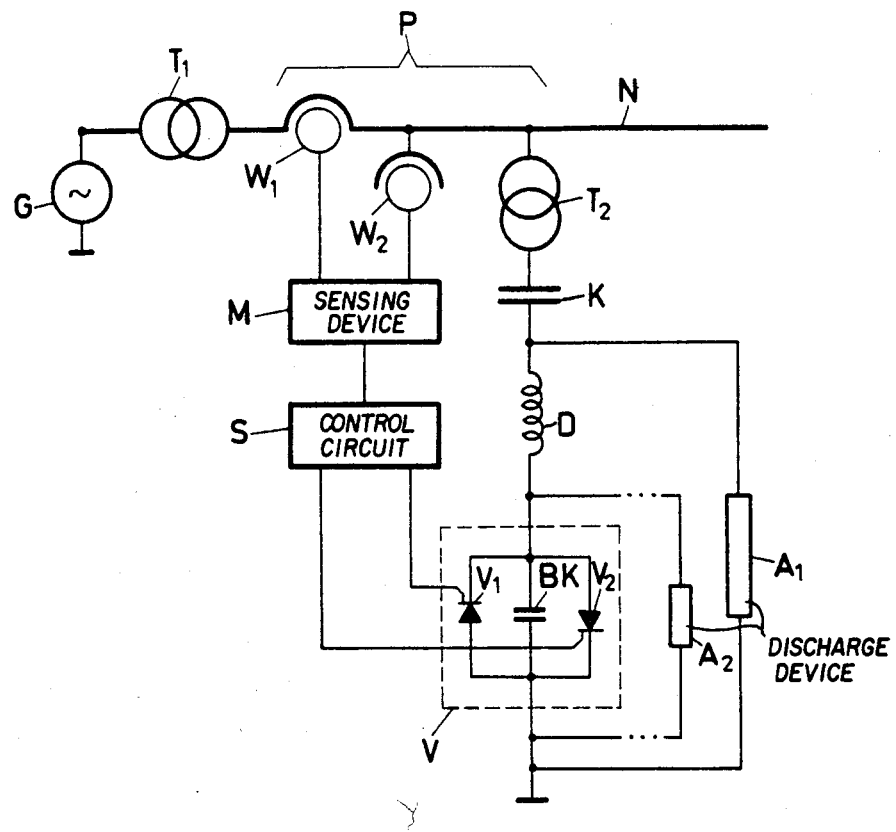
FIG. 1 shows a circuit diagram of the circuit arrangement of the present invention.

Referring now to the drawings wherein the reference numerals designate identical or corresponding parts throughout the several views and more particularly to FIG. 1 which shows an alternating-current grid N fed from a generator G across a first transformer $T_1$. Connected to this alternating-current grid N at a connecting point P, for example by way of a second transformer $T_2$, is a series circuit consisting of a capacitor K, an inductor D and a thyristor rectifier V. An air-core inductor is preferably used as an inductor. The thyristor rectifier is comprised of two antiparallel thyristors $V_1$ and $V_2$, whose control electrodes are connected to the output of a control circuit S. The control circuit input is connected to the output a sensing device M, which in turn is connected by way of a current transformer $W_1$ and a voltage transformer $W_2$, similarly at the connection point P, to the alternating-current voltage grid N. Indicated by $A_1$ is a first discharge device, e.g., a zinc oxide discharge device, which, according to the present invention, is connected by way of the series circuit arrangement of the thyristor rectifier V and the inductor D.

For simplicity's sake, the alternating current voltage grid N is shown as single-phase in FIG. 1. In the instance of a three-phase alternating-current voltage grid, the circuit connected at the terminal P of FIG. 1 would be correspondingly shown as three-phase.

Further characteristics of the circuit arrangement according to FIG. 1 will be evident from the following functional description.

With the aid of an error-sensing device M, an electrical signal is formed from the current and voltage signals which are sensed from the alternating-current voltage grid N by the current transformer $W_1$ and the voltage transformer $W_2$ in a well-known fashion, said signal corresponding to the reactive power at the terminal P. This signal is then fed to the control circuit S. The control circuit, similarly in a well-known fashion, produces ignition or triggering impulses for the control electrodes of the thyristors $V_1$ and $V_2$ in the thyristor rectifier V, in each case only at the minimum of the alternating-current voltage at the thyristor rectifier V. This occurs when the capacitor K needs to be switched on to the alternating-current voltage grid owing to the reactive power balance or for maintenance of the voltage. By means of the ignition impulses, the thyristor rectifier V becomes conductive and the capacitance of the capacitor K becomes available for the compensation of the reactive power in the alternating-current voltage net N.

Figure 2:
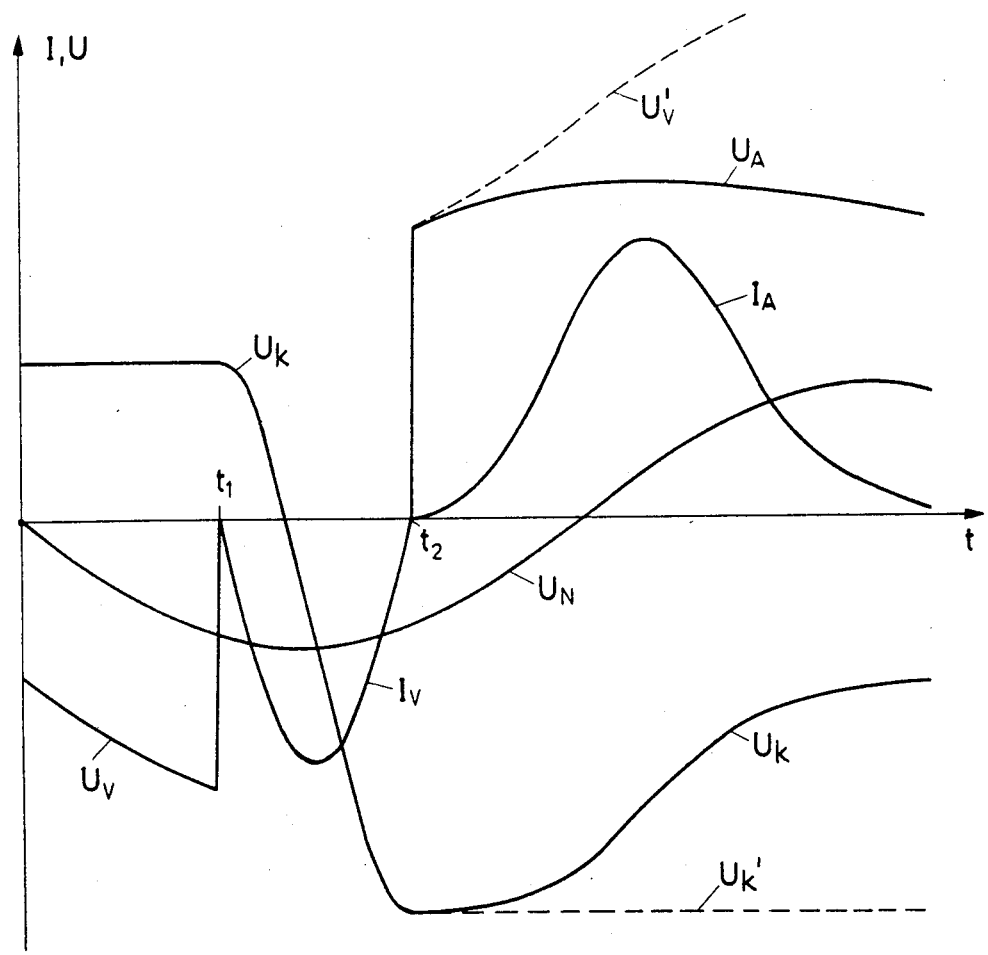
FIG. 2 shows a graph of current and voltage magnitudes versus time before and after a misfire.

Referring now to FIG. 2, it will be further explained how the currents and the voltages at the individual circuit sections K, D, V of the series circuit arrangement as well as at the first discharge device $A_1$ of FIG. 1, behave in time before and after a misfire of the thyristor $V_1$.

A sine-shaped curve of the grid voltage is indicated in FIG. 2 by $U_N$. What should be understood as the grid voltage is the alternating-current voltage at the secondary, i.e., the low-voltage side, of the second transformer $T_2$. Indicated by $I_V$ and $U_V$ are the voltage and the current at the thyristor rectifier V with $U_K$ being the voltage at the capacitor K and $I_A$ the current in the first discharge device $A_1$.

Previous to a point in time $t_1$, which is indicated on the time axis t shown in FIG. 2, the thyristor rectifier should be in the off-state. In this state a constant voltage $U_K$ is found at the capacitor K, the magnitude of which in the sequence of grid voltage variations is somewhat greater than the depicted amplitude of the grid voltage $U_N$ and whose polarity is assumed to be positive. The voltage $U_K$ at the thyristor rectifier is the result in this state of the difference between the capacitor voltage $U_K$ and the grid voltage $U_N$. At the point in time $t_1$, a misfire of the thyristor $V_1$ is assumed. At the point of the misfire the thyristor $V_1$ becomes conductive, whereby the rectifier voltage $U_V$ goes to zero and rectifiers current $I_V$ begins to flow through the thyristor rectifier V or, more specifically, the thyristor $V_1$. The rectifier current $I_V$ at the same time represents a charging or discharging current for the capacitor K. The capacitance of the capacitor K, together with the inductance of the inductor D and the inductance of the second transformer $T_2$, as well as the alternating-current voltage grid N form a series oscillating circuit. The time constant of the rectifier current $I_V$ and of the capacitor voltage $U_C$ is determined after $t_1$ by the properties of this series oscillating circuit. The capacitor voltage $U_K$ oscillates from its constant value before $t_1$ far beyond its equilibrium value determined by the particular instantaneous value of the grid voltage $U_N$ and can attain more than three times the negative amplitude of the grid voltage. The frequency of the oscillation corresponds to the natural frequency of the indicated series oscillator circuit. This circuit may be adjusted by way of the value of the inductance of the inductor D in such a way that in the thyristor rectifier V, no overly abrupt rise and no overly high peak value of the rectifier current $I_V$ occurs. Parallel to this, an effort can be made to tune the natural frequency to the frequency of one of the upper waves of the fundamental modes of the grid voltage $U_N$. The series oscillating circuit then functions advantageously as an acceptor circuit for this upper wave. At the moment in time $t_2$ indicated on the time axis t in FIG. 2, the rectifier current $I_V$ becomes equal to zero at the same time that capaciter voltage $U_K$ reaches a maximum. This causes the current-conductive thyristor $V_1$ to revert automatically to the off-state once again. The oscillation is thereby interrupted and the capacitor voltage $U_K$ would, without the hereinafter explained effect of the first discharge device $A_1$, as, prior to $t_1$, take on a time-constant value as shown in FIG. 2 with a dotted line and indicated by $U_K'$. Similarly, as preceding $t_1$, the thyristor rectifier V, at the moment $t_2$, assumes once again a voltage equal to the difference of the capacitor voltage $U_K$ and the grid voltage $U_N$. The time graph of the voltage shown in FIG. 2 and indicated by $U_V$, follows grid voltage changes and without the operation of the first discharge device would attain the overvoltages already mentioned above. At this point the first discharge device intrudes protectively and limits the rectifier voltage $U_V$ to a predetermined safety level which should be the non-critical value $U_A$ for the thyristor rectifier V but which is still greater than the twice the amplitude of the grid voltage $U_N$. The capacitor K thereby is discharged by the discharge current $I_A$ flowing over the first discharge device A, to a lesser voltage.

For the attainment of the protective function so described, it is immaterial whether the discharge device $A_1$ is connected directly, as in the prior art circuit arrangement, by way of the thyristor rectifier V and the inductor D, or in accordance with the present invention. The difference is significant, however, if a further secnod misfire, namely of the thyristor $V_2$ should occur, while the first discharge device $A_1$ is still bearing the discharge current. The discharge current $I_A$ will, as already remarked, commutate at the second misfire of the first discharge device $A_1$ to the rectifier current path and bring about a current surge at that point. If the abruptness of the current surge is greater than the velocity of propagation of the conductivity at the plane of the ignited thyristor $V_2$, which is always the case with the prior art circuit arrangement, then the ignited thyristor $V_2$ will be destroyed by the local overheating. In the circuit arrangement proposed by the present invention, the current surge in the ignited thyristor, on the other hand, is always advantageously limited by the inductor D located in the current path of the commutation flow.

The preferred embodiment of the invention is derived from the circuit arrangement shown in FIG. 1 by the addition of a second discharge device $A_2$. The second discharge device $A_2$ is directly connected above the thyristor rectifier V.

The second discharge device has the function of limiting an overshooting of the voltage $U_V$ at the thyristor rectifier V. Such an overshooting can e.g. occur in the series oscillator circuit composed of the capacitance of the thyristor rectifier V and the inductance of the inductor D if, again referring to FIG. 2, after a first misfire at the time point $t_1$, the ignited thyristor $V_1$ at time point $t_2$ changes into the off-state at the zero-passage of the rectifier current $I_V$ and this series oscillator circuit of the thyristor rectifier V and the inductor D takes over the differential voltage between the grid voltage $U_N$ and the capacitor voltage $U_K$.

The indicated voltage of the thyristor rectifier V results essentially from the barrier layer capacitances of the thyristor $V_1$, $V_2$ and a wiring capacitance BK which is present owing to the uniform voltage distribution to the thyristors in most thyristor rectifiers. Despite this wiring capacitance BK, the capacitance of the thyristor rectifier is always small in comparison to the capacitance of the capacitor K. So too is the inductance of the inductor D less than the inductance of the second transformer $T_2$. It follows from this that the oscillation period of the series oscillation circuit, formed by the thyristor rectifier V and the inductor D is small in comparison with the oscillation period of the series oscillator circuit formed by the capacitor K, inductor D and transformer $T_2$, including the alternating-current voltage system N. The overshooting of the voltage $U_V$ at the thyristor rectifier V is thus an essentially faster process than the reversing of the capacitor K after a misfire. Nonetheless, with the limitation of this overshooting in the second diverter, no power values on the order of those of the current conduction in the first discharge device $A_1$ are achieved since the storage energy in the thyristor rectifier V is substantially smaller than in the capacitor K. The second discharge device $A_2$ can therefore be designed with a lesser power than the first discharge device $A_1$. The second discharge device is also advantageously a zinc oxide discharge device.

Obviously, numerous modifications and variations of the present invention are possible in light of the above teachings. It is therefore to be understood that within the scope of the appended claims, the invention may be practiced otherwise than as specifically described herein.

What is claimed and desired to be secured by Letters Patent of the United States is:

1. An electrical circuit for the compensation of reactive power in an electrical alternating-current power system, comprising:
   a capacitor;
   an inductor;
   a thyristor rectifier;
   said capacitor, said inductor and said rectifier being connected in a first series circuit to said power system;
   a first overvoltage discharge means connected in parallel to a second series circuit of said inductor and said rectifier; and
   a second overvoltage discharge means connected in parallel with said rectifier containing a protective level at least as high as that of said first overvoltage discharge means.

2. The circuit according to claim 1 wherein the protection level of said first overvoltage discharge means is greater than twice the amplitude of said alternating current.

3. The circuit acording to claim 1 wherein said first overvoltage discharge means is a zinc oxide discharge means.

4. The circuit according to claim 1 wherein said second overvoltage discharge means is designed with lesser power than said first overvoltage discharge means.

5. The circuit according to claim 1 wherein said second overvoltage discharge means is a zinc oxide discharge means.

6. An electrical circuit for the compensation of reactive power in an electrical alternating current power system comprising:
   a transformer having an input connected to said power system and an output;
   a capacitor having a first terminal connected to said output of said transformer and a second terminal;
   an inductor having a first terminal connected to said second terminal of said capacitor and a second terminal;
   a thyristor rectifier having a first terminal connected to said second terminal of said inductor and a second terminal connected to ground;
   a first overvoltage discharge means having a first terminal connected to said second terminal of said capacitor and to said first terminal of said inductor and a second terminal connected to ground;
   a second overvoltage discharge means having a first terminal connected to said second terminal of said inductor and to said first terminal of said rectifier and a second terminal connected to ground.

* * * * *